(12) United States Patent
Lee

(10) Patent No.: US 9,490,178 B2
(45) Date of Patent: Nov. 8, 2016

(54) METHOD OF MANUFACTURING A SEMICONDUCTOR DEVICE

(71) Applicant: SAMSUNG ELECTRONICS CO., LTD., Suwon-Si, Gyeonggi-Do (KR)

(72) Inventor: Joon-Hyung Lee, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/847,168

(22) Filed: Sep. 8, 2015

(65) Prior Publication Data

US 2016/0148847 A1 May 26, 2016

(30) Foreign Application Priority Data

Nov. 25, 2014 (KR) .................. 10-2014-0165504

(51) Int. Cl.
*H01L 21/8238* (2006.01)
*H01L 27/092* (2006.01)

(52) U.S. Cl.
CPC .......... *H01L 21/823857* (2013.01); *H01L 21/823807* (2013.01); *H01L 27/0922* (2013.01)

(58) Field of Classification Search
CPC ........... H01L 21/823857; H01L 21/823807; H01L 21/0217; H01L 21/0223; H01L 21/02532; H01L 21/31111; H01L 21/31144; H01L 27/0922
USPC .................... 438/199, 205, 216, 275, 287
See application file for complete search history.

(56) References Cited

U.S. PATENT DOCUMENTS

| | | | |
|---|---|---|---|
| 6,492,671 B2 | 12/2002 | Soderbarg | |
| 8,574,974 B2 | 11/2013 | Minami | |
| 2006/0170047 A1 | 8/2006 | Ishimaru | |
| 2007/0257308 A1* | 11/2007 | Lee | G11C 11/412 257/334 |
| 2010/0167482 A1 | 7/2010 | Mori et al. | |
| 2011/0159678 A1* | 6/2011 | Hsu | H01L 21/82345 438/587 |
| 2012/0139057 A1* | 6/2012 | Goto | H01L 21/28167 257/392 |
| 2014/0170844 A1 | 6/2014 | Chudzik et al. | |
| 2014/0183645 A1 | 7/2014 | Wann et al. | |
| 2014/0197497 A1 | 7/2014 | Ito | |

FOREIGN PATENT DOCUMENTS

| | | |
|---|---|---|
| KR | 100409033 | 12/2003 |
| KR | 1020090125941 | 12/2009 |
| KR | 1020100007533 | 1/2010 |
| KR | 1020100074900 | 7/2010 |

* cited by examiner

*Primary Examiner* — Kevin M Picardat
(74) *Attorney, Agent, or Firm* — F. Chau & Associates, LLC

(57) ABSTRACT

A method of manufacturing a semiconductor device includes preparing a semiconductor substrate having a first and a second voltage device portion, each including a first and a second conductive type MOS region, forming a first gate insulating layer on the first and the second voltage device portion, removing the first gate insulating layer from the first conductive type MOS region of the first voltage device portion to expose a part of the semiconductor substrate, forming a first semiconductor layer on the first conductive type MOS region of the first voltage device portion, and removing the first gate insulating layer from the second conductive type MOS region of the first voltage device portion to expose a part of the semiconductor substrate.

19 Claims, 11 Drawing Sheets

METHOD OF MANUFACTURING A SEMICONDUCTOR DEVICE

CROSS-REFERENCE TO RELATED APPLICATIONS

This application claims priority under 35 U.S.C. §119 to Korean Patent Application No. 10-2014-0165504, filed on Nov. 25, 2014, the disclosure of which is incorporated by reference herein in its.

TECHNICAL FIELD

Exemplary embodiments of the inventive concept relate to a method of fabricating a semiconductor device, and more particularly, to a method of fabricating a semiconductor device having a stabilized device characteristic.

DISCUSSION OF RELATED ART

Recently, an embedded high voltage semiconductor device process based on an ultra-fine process has been developed to increase chip density. In a conventional semiconductor device, a silicon germanium (SiGe) layer may be formed on a channel region of a low voltage semiconductor device while a high voltage semiconductor device is embedded, requiring increased photo masks and additional wet etching and cleaning processes.

SUMMARY

Exemplary embodiments of the inventive concept provide a method of manufacturing a semiconductor device with an embedded high voltage semiconductor device for reducing manufacturing costs and improving device characteristics.

According to an exemplary embodiment of the inventive concept, there is provided a method of manufacturing a semiconductor device which includes preparing a semiconductor substrate having a first voltage device portion and a second voltage device portion, each including a first conductive type MOS region and a second conductive type MOS region, forming a first gate insulating layer on the first voltage device portion and the second voltage device portion, removing the first gate insulating layer from the first conductive type MOS region of the first voltage device portion to expose a part of the semiconductor substrate, forming a first semiconductor layer on the first conductive type MOS region of the first voltage device portion and removing the first gate insulating layer from the second conductive type MOS region of the first voltage device portion to expose a part of the semiconductor substrate.

In an exemplary embodiment of the inventive concept, the forming of the first semiconductor layer may include epitaxially growing a material having a different lattice constant from that of the semiconductor substrate.

In an exemplary embodiment of the inventive concept, a higher voltage may be applied to the first voltage device portion and a lower voltage may be applied to the second voltage device portion.

In an exemplary embodiment of the inventive concept, a source region and a drain region in the first conductive type MOS region may include p-type dopants, and a source region and a drain region in the second conductive type MOS region may include n-type dopants.

In an exemplary embodiment of the inventive concept, the first gate insulating layer may be formed by a medium temperature oxide (MTO) process.

In an exemplary embodiment of the inventive concept, a wet etching process may be performed to remove the first gate insulating layer.

In an exemplary embodiment of the inventive concept, the method may further include, after forming of the first gate insulating layer on the first voltage device portion and the second voltage device portion, forming a hard mask layer on the first gate insulating layer and removing the hard mask layer from the first conductive type MOS region of the first voltage device portion to expose a part of the first gate insulating layer.

In an exemplary embodiment of the inventive concept, the hard mask layer may be a silicon nitride layer.

In an exemplary embodiment of the inventive concept, the method may further include, after removing the first gate insulating layer from the second conductive type MOS region of the first voltage device portion, forming a second gate insulating layer on the first voltage device portion.

In an exemplary embodiment of the inventive concept, a dielectric constant of the second gate insulating layer may be greater than that of the first gate insulating layer.

According to an exemplary embodiment of the inventive concept, there is provided a method of manufacturing a semiconductor device which includes preparing a semiconductor substrate divided into a high voltage device portion and a low voltage device portion, each including a pMOS region and an nMOS region, forming first gate insulating layer and a silicon nitride layer on the high voltage device portion and the low voltage device portion, patterning the silicon nitride layer in the pMOS region of the low voltage device portion by using a patterned first photosensitive layer, removing the first gate insulating layer from the pMOS region of the low voltage device portion by using the patterned silicon nitride layer to expose a part of the semiconductor substrate, removing the patterned silicon nitride layer, forming a first semiconductor layer on the pMOS region of the low voltage device portion, and removing the first gate insulating layer from the nMOS region of the low voltage device portion by using a patterned second photosensitive layer to expose a part of the semiconductor substrate.

In an exemplary embodiment of the inventive concept, the forming of the first semiconductor layer may include epitaxially growing a silicon germanium (SiGe) layer.

In an exemplary embodiment of the inventive concept, a wet etching process is performed to remove the first gate insulating.

In an exemplary embodiment of the inventive concept, the method may further include, after removing the first gate insulating layer from the nMOS region of the low voltage device portion, forming a second gate insulating layer on the low voltage device portion.

In an exemplary embodiment of the inventive concept, a dielectric constant of the second gate insulating layer may be greater than that of the first gate insulating layer.

According to an exemplary embodiment of the inventive concept, there is provided a method of manufacturing a semiconductor device which includes forming a semiconductor substrate having a first voltage device portion and a second voltage device portion, each including a first conductive type MOS region and a second conductive type MOS region, forming a first gate insulating layer on the first voltage device portion and the second voltage device portion, removing the first gate insulating layer from the first voltage device portion to expose the first voltage device portion on the semiconductor substrate, and forming a first semiconductor layer on the first conductive type MOS region of the first voltage device portion.

In an exemplary embodiment of the inventive concept, a higher voltage may be applied to the first voltage device portion and a lower voltage may be applied to the second voltage device portion. A source region and a drain region in the first conductive type MOS regions may contain p-type dopants, and a source region and a drain region in the second conductive type MOS regions may contain n-type dopants.

In an exemplary embodiment of the inventive concept, the method may further include, after forming of the first gate insulating layer on the first voltage device portion and the second voltage device portion, forming a first mask layer on the first gate insulating layer, and patterning the first mask layer on the first voltage device portion by using a patterned first photosensitive layer.

In an exemplary embodiment of the inventive concept, the method may further include, removing the first gate insulating layer from the first voltage device portion to expose the first voltage device portion on the semiconductor, forming a second mask layer on the first voltage device portion and the second voltage device portion, and patterning the second mask layer on the first conductive type MOS region of the first voltage device portion by using a patterned second photosensitive layer.

In an exemplary embodiment of the inventive concept, the method may further include, after forming the first semiconductor layer in the first conductive type MOS region of the first voltage device portion, forming a second gate insulating layer on the first voltage device portion.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
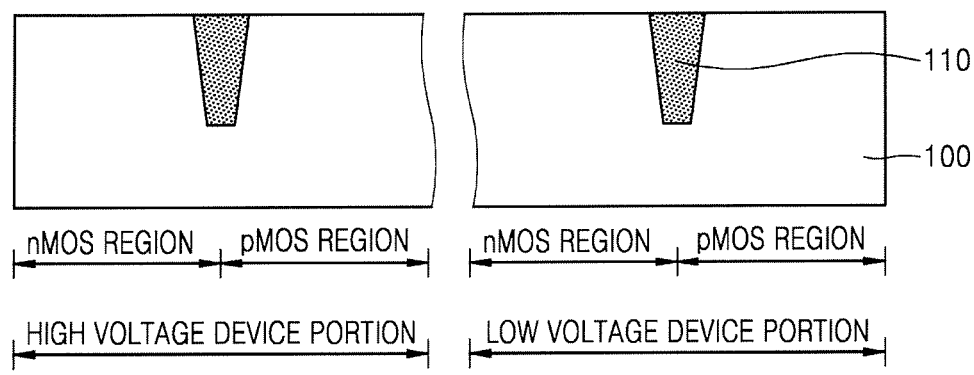
FIGS. 1 to 13 show diagrams forming a semiconductor device according to an exemplary embodiment of the inventive concept.

Exemplary embodiments of the inventive concept will now be described more fully with reference to the accompanying drawings, It should be understood, however, that the inventive concept may be embodied in many different forms and should not be construed as being limited to the embodiments set forth herein. Like reference numerals in the drawings may denote like elements, and thus their description will be omitted. Sizes of components in the drawings may be exaggerated for convenience of explanation.

An expression used in the singular encompasses expression of the plural, unless it has a clearly different meaning in the context. Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Hereinafter, one or more exemplary embodiments of the inventive concept will be described in detail with reference to the accompanying drawings.

FIGS. 1 to 13 are diagrams of a method of manufacturing a semiconductor device according to an exemplary embodiment of the inventive concept.

FIG. 1 shows a semiconductor substrate 100 including a low voltage device portion and a high voltage device portion.

Each of the low voltage device portion and the high voltage device portion may include a pMOS region and an nMOS region. Each of the pMOS region and the nMOS region may include a plurality of semiconductor devices. The semiconductor devices formed on the semiconductor substrate 100 may be electrically isolated from one another by a device isolation layer 110.

The semiconductor substrate 100 may be a silicon (Si) substrate, for example, a crystalline Si substrate, a polycrystalline Si substrate, or an amorphous Si substrate. In an exemplary embodiment of the inventive concept, the semiconductor substrate 100 may be a germanium (Ge) substrate or a compound semiconductor substrate such as a SiGe substrate, a silicon carbide (SiC) substrate, a gallium arsenide (GaAs) substrate, an indium arsenide (InAs) substrate, or an indium phosphide (InP) substrate. In an exemplary embodiment of the inventive concept, the semiconductor substrate 100 may include a conductive region, for example, a well doped with impurities or a structure doped with impurities. Hereinafter, for purpose of illustration, the semiconductor substrate 100 is a Si substrate.

The device isolation layer 110 may be formed of an insulating layer, or may include an external insulating layer and an internal insulating layer. The external insulating layer and the internal insulating layer may be formed of different materials from each other. For example, the external insulating layer may be formed of an oxide layer, and the internal insulating layer may be formed of a nitride layer. However, a configuration of the device isolation layer 110 is not limited to the above examples. For example, the device isolation layer 110 may have a multi-layered structure, e.g., having a combination of at least three kinds of insulating layers.

According to an exemplary embodiment of the inventive concept, the low voltage device portion may be a first voltage device portion. The low voltage device portion may be used as a relative concept with respect to the high voltage device portion. An operating voltage applied to the low voltage device portion may be about 1.0 to about 1.2 volt. The semiconductor devices formed in the low voltage device portion are suitable for low power consumption devices. Since the operating voltage of the semiconductor device on the low voltage device portion is relatively low, it is necessary to control a threshold voltage more accurately than the other semiconductor devices existing in other device portions.

The low voltage device portion may include an intermediate-voltage device portion. The intermediate-voltage device portion may be a relative concept with respect to the low voltage device portion and the high voltage device portion. An operating voltage applied to the intermediate-voltage device portion may be about 1.5 to about 3.3 volt.

According to an exemplary embodiment of the inventive concept, the high voltage device portion may be a second voltage device portion. The high voltage device portion may be a relative concept with respect to the low voltage device portion. An operating voltage applied to the high voltage device portion may be about 5.0 to about 10.0 volt. The semiconductor devices formed in the high voltage device portion are suitable for high power consumption devices or high speed operating devices.

The pMOS region and the nMOS region are in active areas of the semiconductor devices. The pMOS region and the nMOS region may be isolated from each other by the device isolation layer 110.

A first conductive type MOS region and a second conductive type MOS region may be used as relative concepts with respect to each other. For example, the first conductive type MOS region may be the pMOS region and the second conductive type MOS region may be the nMOS region. For example, the first conductive type MOS region may be the nMOS region and the second conductive MOS region may be the pMOS region.

Figure 2:
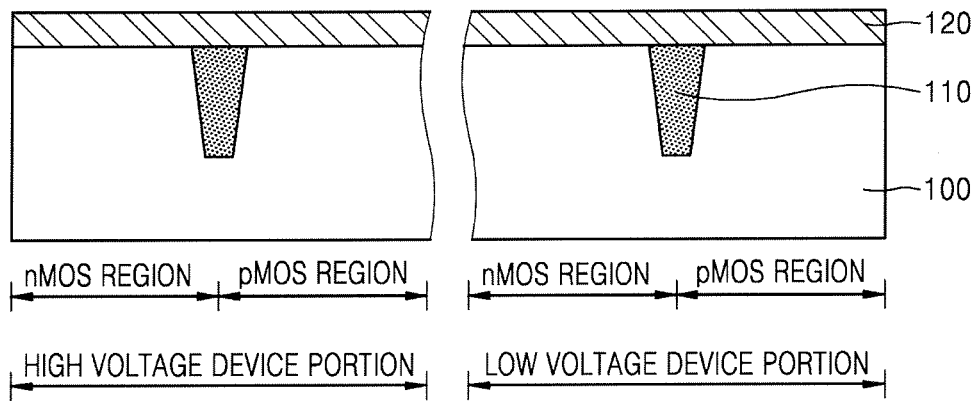

FIG. 2 shows a first gate insulating layer 120 formed on the low voltage device portion and the high voltage device portion.

The first gate insulating layer 120 may be formed of a silicon oxide layer, a silicon nitride layer, a silicon oxynitride layer, an oxide/nitride/oxide (ONO) layer, or a high-k dielectric film having a higher dielectric constant than that of the silicon oxide layer. For example, the first gate insulating layer 120 may have a dielectric constant ranging from about 10 to about 25. In an exemplary embodiment of the inventive concept, the first gate insulating layer 120 may be formed of hafnium oxide (HfO), hafnium silicon oxide (HfSiO), hafnium oxynitride (HfON), hafnium silicon oxynitride (HfSiON), lanthanum oxide (LaO), lanthanum aluminium oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminium oxide (AlO), or lead scandium tantalum oxide (PbScTaO). In an exemplary embodiment of the inventive concept the first gate insulating layer 120 may be formed of $HfO_2$, $Al_2O_3$, $HfAlO_3$, $Ta_2O_3$, or $TiO_2$.

Hereinafter, for purpose of illustration, the first gate insulating layer 120 is the silicon oxide layer. The first gate insulating layer 120 may be formed by using a medium temperature oxide process. The first gate insulating layer 120 may be formed from about 100 Å to about 600 Å.

In an exemplary embodiment of the concept inventive, the first gate insulating layer 120 may be used in the high voltage device portion. The first gate insulating layer 120 may be used in a semiconductor device for high voltage, and accordingly, the first gate insulating layer 120 may have a greater thickness than that of a second gate insulating layer 150 (see FIG. 10) used in the low voltage device portion.

A multi-oxide process may be applied for forming a desired thickness for various gate insulating layers on the semiconductor substrate 100. The gate insulating layers may have various thicknesses so that different operating voltages may be applied thereto. For example, two types of gate insulating layers of different thicknesses may be formed on the semiconductor substrate 100 by using the multi-oxide process. The region where the semiconductor device having a thin gate insulating layer may be referred to as the low voltage device portion, and the region where the semiconductor device having a thick gate insulating layer may be referred to as the high voltage device portion. In such a way, the semiconductor substrate 100 may be divided into the low voltage device portion and the high voltage device portion based on the operating voltage.

Figure 3:
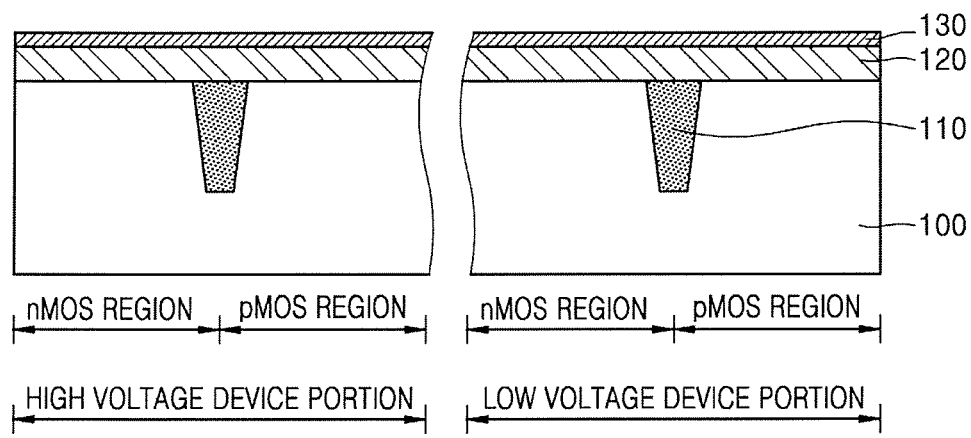

FIG. 3 shows a hard mask layer 130 formed on the first gate insulating layer 120.

The hard mask layer 130 may be performed as a mask for etching a part of the first gate insulating layer 120 in post-processes. Therefore, the hard mask layer 130 may be formed of a material having high etch selectivity with respect to the first gate insulating layer 120. In an exemplary embodiment of the inventive concept, the hard mask layer 130 may be a silicon nitride layer.

Figure 4:
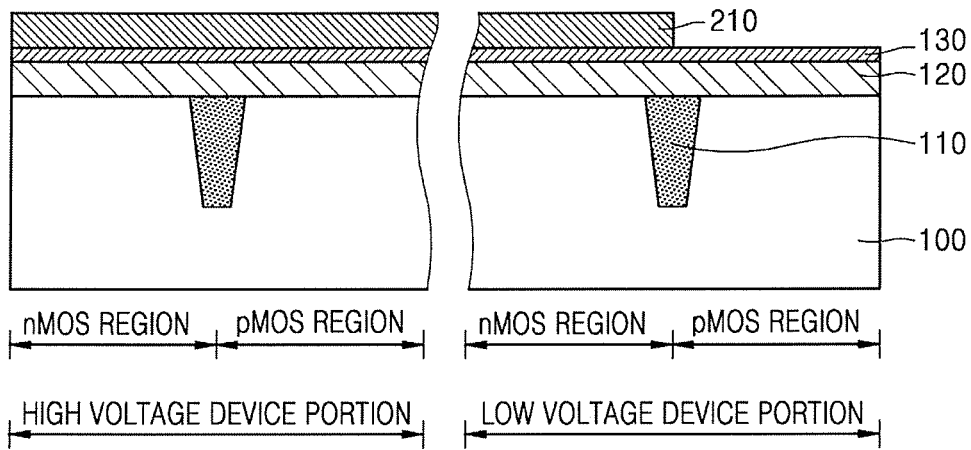

FIG. 4 shows a first photosensitive layer 210 formed on the hard mask layer 130 through an exposure process.

The first photosensitive layer 210 used in the exposure process may be a positive type photosensitive resin or a negative type photosensitive resin. The first photosensitive layer 210 may be removed by an ashing process and a strip process after etching the hard mask layer 130.

Figure 5:
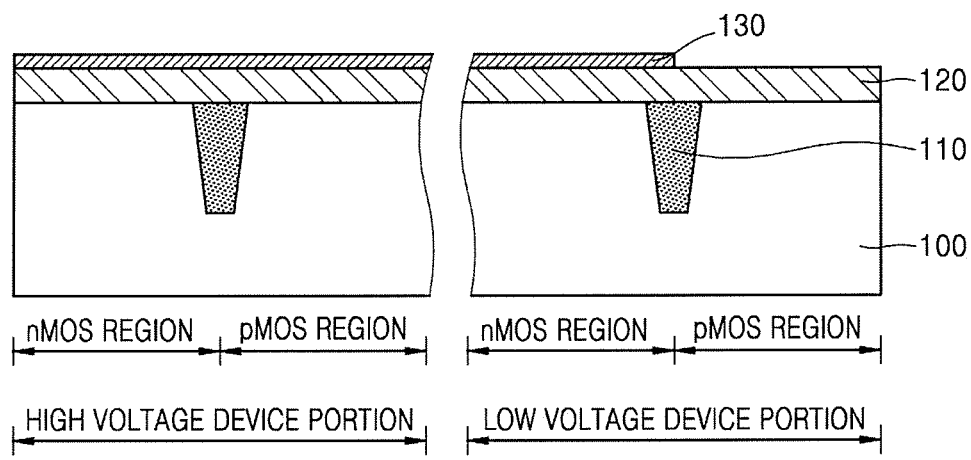

As illustrate in FIG. 5, the hard mask layer 130 on the pMOS region of the low voltage device portion is removed by using the first photosensitive layer 210 (see FIG. 4) as a mask.

To satisfy electric characteristics of the low voltage semiconductor device in the low voltage device portion the gate insulating layer may be reduced to a desired thickness. A material forming the gate insulating layer in the low voltage semiconductor device may be substituted with a high-k material having a greater dielectric constant than that of the silicon oxide layer. The high-k material may form a strain in a channel of the pMOS region so that a mobility of electronics may be improved, resulting in less leakage current.

A first semiconductor layer 140 (see FIG. 7) may have a greater lattice constant than that of the semiconductor substrate 100 so that the strain can be formed in the channel of the pMOS region of the low voltage device portion.

Figure 6:
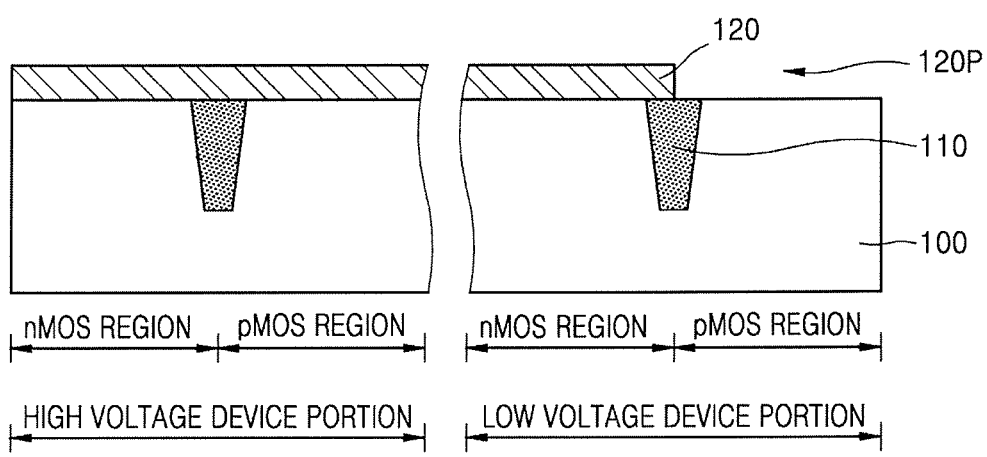

As illustrate in FIG. 6, the first gate insulating layer 120 is removed from the pMOS region of the low voltage device portion by using the hard mask layer 130 (see FIG. 5) as an etching mask.

A semiconductor substrate 120P on the pMOS region of the low voltage device portion may be exposed through the etching process. The first gate insulating layer 120 formed on the pMOS region of the low voltage device portion may be removed by a wet etching process.

After removing the first gate insulating layer 120 from the pMOS region of the low voltage device portion, the hard mask layer 130 (see FIG. 5) may be removed.

Figure 7:
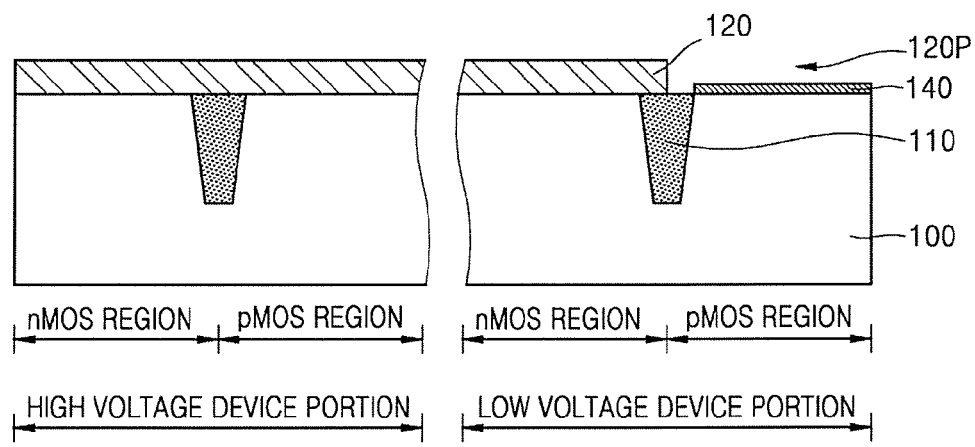

FIG. 7 shows the first semiconductor layer 140 formed on the pMOS region of the low voltage device portion.

The first semiconductor layer 140 formed on the pMOS region of the low voltage device portion may be formed of Si, SiGe, or a material suitable for an epitaxial growth method. Hereinafter, for purpose of illustration, the first semiconductor layer 140 is formed of SiGe.

A lattice structure in the channel region may be determined by those of the semiconductor substrate 100 and the first semiconductor layer 140. For example, the channel region in the pMOS region of the low voltage device portion may contain about 30 at % Ge, and thus the epitaxial growth method may be executed to reduce lattice defect with respect to the semiconductor substrate 100.

The epitaxial growth of the SiGe layer may be selectively formed on the pMOS region of the low voltage device portion by forming the first gate insulating layer 120 on the high voltage device portion and the nMOS region of the low voltage device portion.

According to an exemplary embodiment of the inventive concept, the first gate insulating layer may function as the mask on the nMOS region of the low voltage device portion to prevent the epitaxial growth of the SiGe layer so that unnecessary exposure and etching processes can be reduced.

Figure 8:
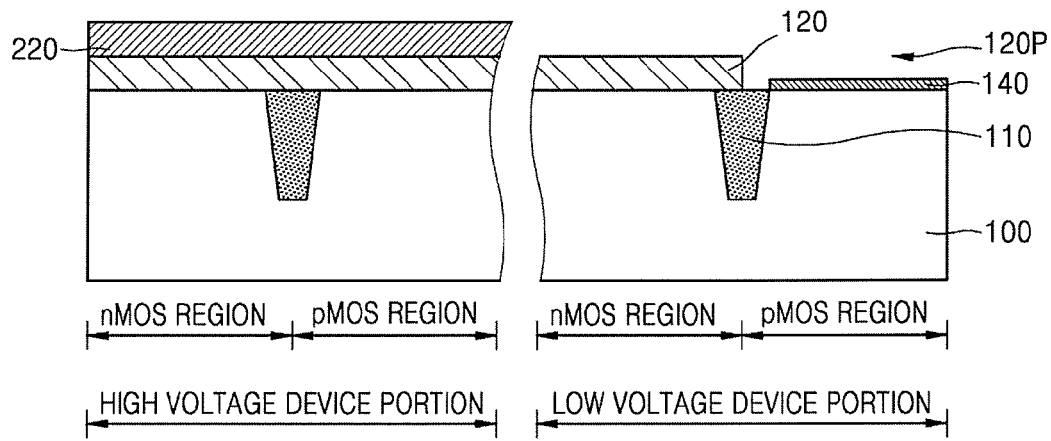

FIG. 8 shows a second photosensitive layer 220 formed on the high voltage device portion for removing the first gate insulating layer 120 from the nMOS region of the low voltage device portion.

The second photosensitive portion 220 may be formed on the high voltage device portion to remove the first gate insulating layer 120 from the low voltage device portion.

Figure 9:
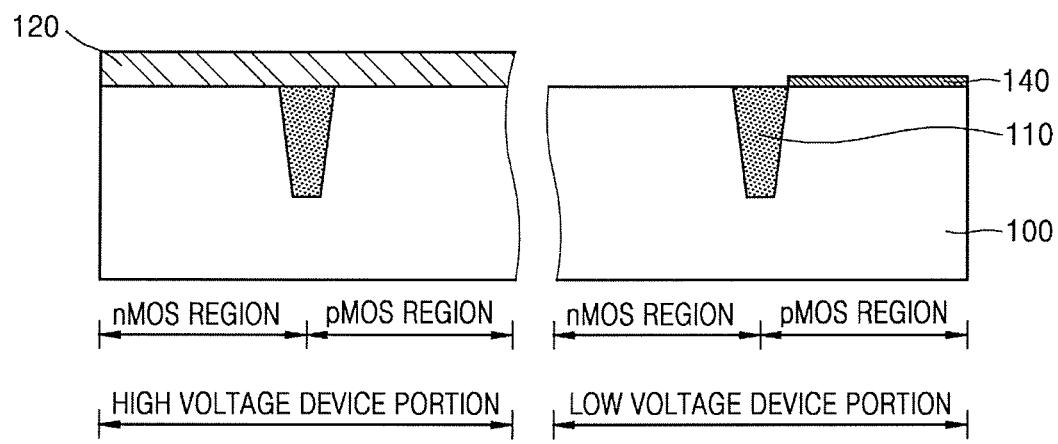

As illustrated in FIG. 9, the first gate insulating layer 120 is removed from the nMOS region of the low voltage device portion.

For example, the first gate insulating layer 120 may be removed by a wet etching process.

Figure 10:
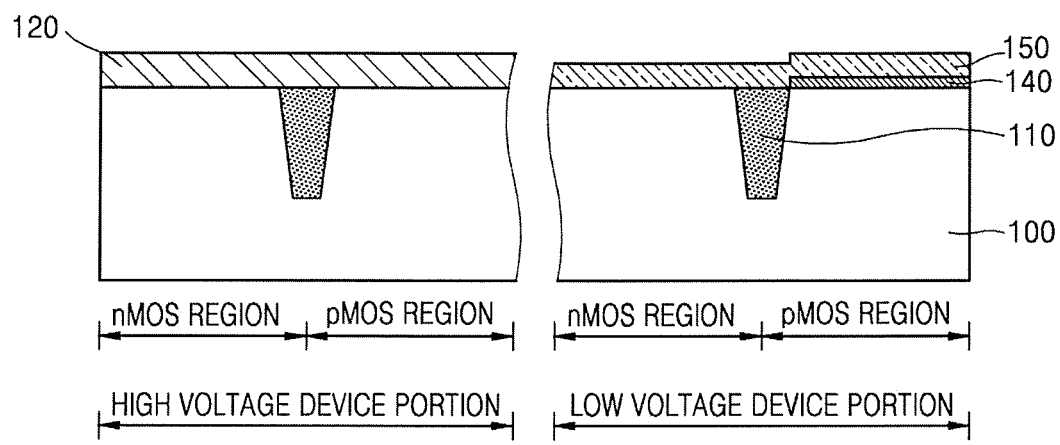

FIG. 10 shows a second gate insulating layer 150 formed on the low voltage device portion.

A mask process may be performed on the high voltage device portion to form the second gate insulating layer 150 on the low voltage device portion.

The second gate insulating layer 150 may be a silicon oxide layer, a silicon nitride layer, an ONO layer, or a high-k layer having a greater dielectric constant than that of the silicon oxide layer. For example, the second gate insulating layer 150 may have a dielectric constant ranging from about 10 to about 25. In an exemplary embodiment of the inventive concept, the second gate insulating layer 150 may be formed of HfO, HfSiO, HfON, HfSiON, LaO, LaAlO, ZrO, ZrSiO, ZrON, ZrSiON, TaO, TiO, BaSrTiO, BaTiO, SrTiO, YO, AlO, or PbScTaO. In an exemplary embodiment of the inventive concept, the second gate insulating layer 150 may be formed of $HfO_2$, $Al_2O_3$, $HfAlO_3$, $Ta_2O_3$, or $TiO_2$.

In the present exemplary embodiment of the inventive concept, it is assumed that the second gate insulating layer 150 is the high-k layer. The second gate insulating layer 150 may have a thickness equal to or less than that of the first gate insulating layer 120.

The multi-oxide process may be applied for forming a desired thickness for various gate insulating layers on the semiconductor substrate 100. The gate insulating layers may have various thicknesses so that different operating voltages may be applied thereto. For example, two types of gate insulating layers of different thicknesses may be formed on the semiconductor substrate 100 by the multi-oxide process. The region where the semiconductor device having a relatively thin gate insulating layer may be referred to as the low voltage device portion, and the region where the semiconductor device having a relatively thick gate insulating layer may be referred to as the high voltage device portion.

Figure 11:
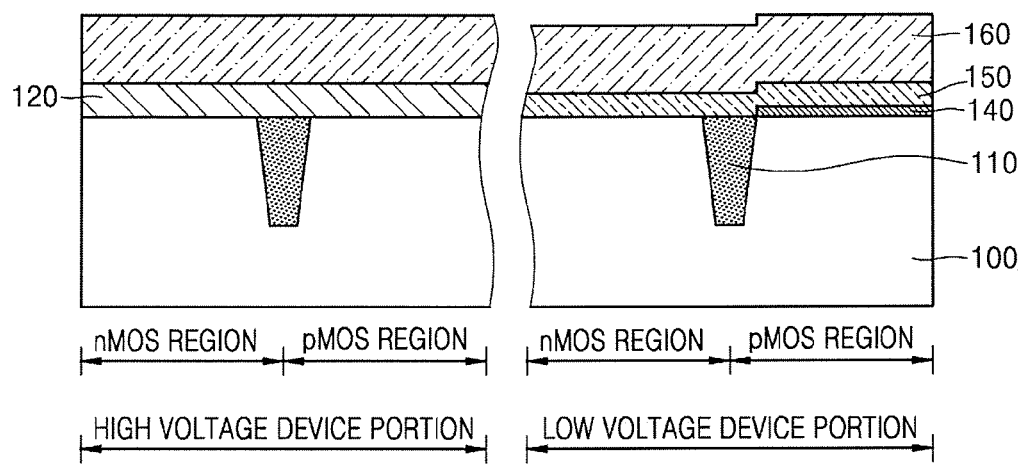

FIG. 11 shows a gate conductive layer 160 formed on the first gate insulating layer 120 and the second gate insulating layer 150.

The gate conductive layer 160 may include a single gate layer or multiple layers.

In an exemplary embodiment of the inventive concept, the gate conductive layer 160 may include a semiconductor doped with impurities, a metal, a conductive metal nitride, or a metal silicide. In an exemplary embodiment of the inventive concept, the gate conductive layer 160 may have a multi-layered structure, in which a first metal silicide layer, a conductive barrier layer, a second metal silicide layer, and an electrode layer formed of a metal or a metal nitride are sequentially stacked. For example, the gate conductive layer 160 may have a stack structure including a doped polysilicon, a TiN layer, and a tungsten layer stacked sequentially.

In an exemplary embodiment of the inventive concept, the gate conductive layer 160 may include a lower gate layer and an upper gate layer. The lower gate layer may be formed of a metal material. For example, the lower gate layer may include tantalum nitride (TaN), titanium nitride (TiN), tungsten (W), tungsten nitride (WN), molybdenum nitride (MoN), molybdenum aluminum nitride (MoAlN), platinum (Pt), nickel (Ni), ruthenium (Ru), titanium aluminum nitride (TiAlN), tantalum carbide (TaC), tantalum silicon nitride (TaSiN), or titanium alum inide (TiAl). The upper gate layer may be formed of a conductive material. For example, the upper gate layer may be a doped silicon layer.

In an exemplary embodiment of the inventive concept, the gate conductive layer 160 may be formed of the same or different materials.

Figure 12:
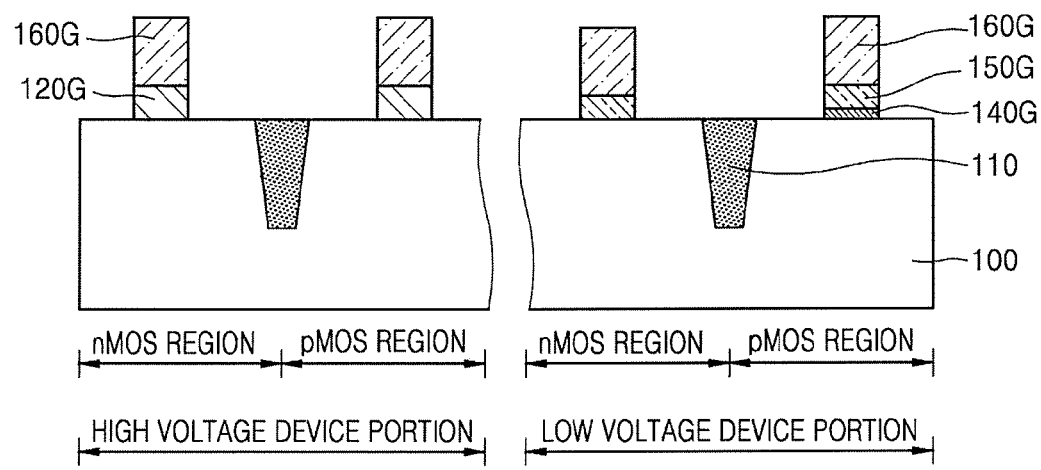

FIG. 12 shows a gate structure formed on the low voltage device portion and the high voltage device portion.

An exposure process and an etching process are performed to form the gate structure including patterning gate electrode patterns 160G, first gate insulating layer patterns 120G, second gate insulating layer patterns 150G, and first semiconductor layer patterns 140G.

In an embodiment of the inventive concept, the forming of the gate structure may include processes of sequentially and anisotropically etching the gate conductive layer 160 (see FIG. 11), the first gate insulating layer 120 (see FIG. 11), the second gate insulating layer 150 (see FIG. 11), and the first semiconductor layer 140 (see FIG. 11) by using the same etching mask. The gate electrode pattern 160G, the first gate insulating layer pattern 120G, the second gate insulating layer pattern 150G, and the first semiconductor layer pattern 140G may be formed side walls. For example, the side walls thereof may be substantially coplanar. Moreover, the first semiconductor layer 140 (see FIG. 11) that is the channel region of the semiconductor device formed on the pMOS region of the low voltage device portion may be patterned together while forming the gate structure. Accordingly, the first semiconductor layer pattern 140G may be formed under the gate structure in the pMOS region of the low voltage device portion.

Figure 13:
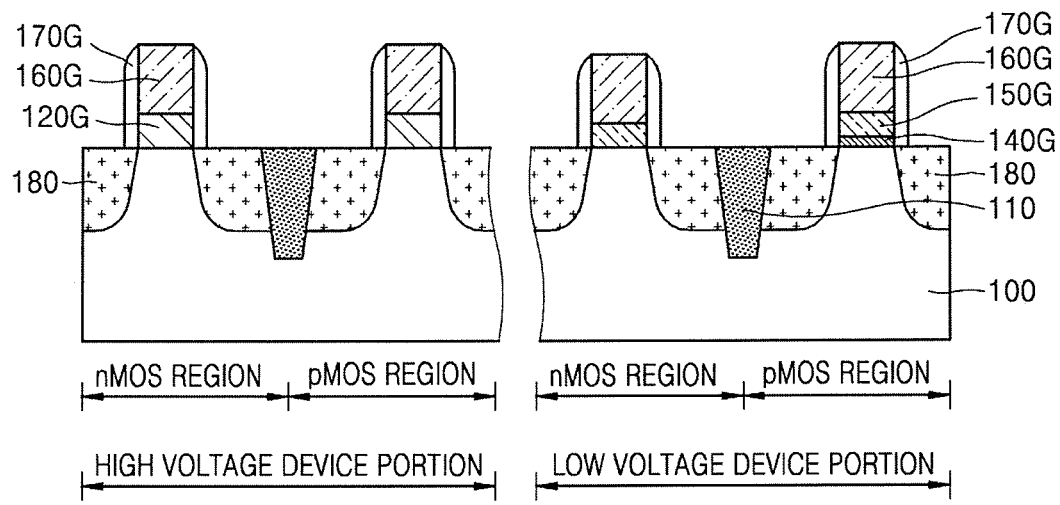

FIG. 13 shows spacers 170G formed on opposite side walls of the gate structure, and source and drain regions 180 formed in the semiconductor substrate 100.

After forming the gate structure on the semiconductor substrate 100, the source and drain regions 180 may be formed in the semiconductor substrate 100. The gate structure may include the gate electrode pattern 160G, the first gate insulating layer pattern 120G, the second gate insulating layer pattern 150G, and/or the first semiconductor layer pattern 140G, according to the region where the gate structure is formed. The source and drain regions 180 may be formed by an ion implantation process that uses the gate structure as a mask. Accordingly, the source and drain regions 180 may be formed in the semiconductor substrate 100 at opposite sides of the gate structure, and the channel region disposed between the source and drain regions 180 is defined under the gate structure.

According to an exemplary embodiment of the inventive concept, after forming the gate structure, the spacers 170G may be formed on side walls of the gate structures. The spacers 170G may be formed of silicon oxide, silicon nitride, or silicon oxynitride. For example, the spacer 170G may be formed as a single layer structure, a dual-layered structure or a triple-layered structure.

The spacers 170G may be used as ion masks for source and drain regions 180. For example, the source and drain regions 180 may be formed by a first and a second ion implantation process performed before and after forming the spacers 170G, respectively.

The source and drain regions 180 formed in the nMOS regions and the pMOS regions of the low voltage device portion and the high voltage device portion may have different conductive types from each other. For example, the source and drain regions 180 may have p-conductive type dopants on the pMOS regions, and have n-conductive type dopants on the nMOS region. The channel region under the gate structure may have the same conductive type as that of the semiconductor substrate 100 located thereunder, and may have the different conductive type from that of the source and drain regions 180 formed around the channel region.

FIGS. 14 to 17 are diagrams of a method of manufacturing a semiconductor device according to an exemplary embodiment of the inventive concept. Referring to FIGS. 14 to 17, the elements may be substantially the same as the elements in the FIGS. 14 to 17, except for the process sequence of photolithography. Thus, any further descriptions concerning the same elements may be omitted.

Figure 14:
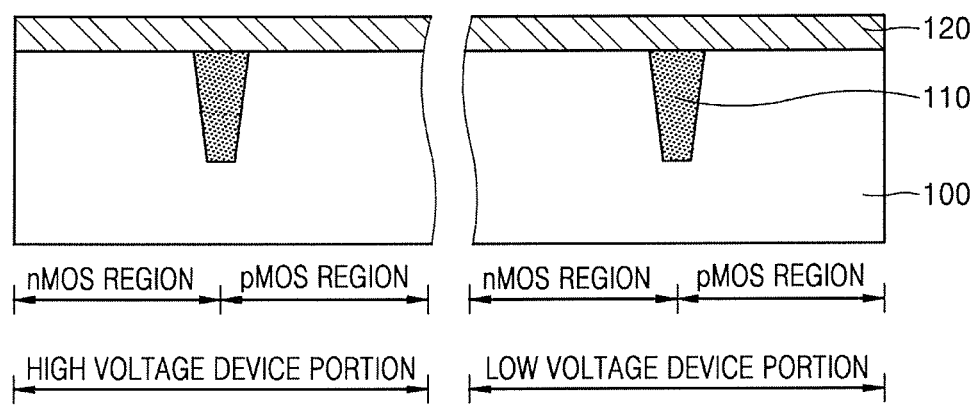
FIGS. 14 to 17 show diagrams forming a semiconductor device according to an exemplary embodiment of the inventive concept.

FIG. 14 shows the first gate insulating layer 120 formed on the low voltage device portion and the high voltage device portion of the semiconductor substrate 100. The first gate insulating layer 120 may be formed of a silicon oxide layer, a silicon nitride layer, a silicon oxynitride layer, an oxide/nitride/oxide (ONO) layer, or a high-k dielectric film having a higher dielectric constant than that of the silicon oxide layer. For example, the first gate insulating layer 120 may have a dielectric constant ranging from about 10 to about 25. Hereinafter, for purpose of illustration, the first gate insulating layer 120 is the silicon oxide layer. The first gate insulating layer 120 may be formed by using a medium temperature oxide process. The first gate insulating layer 120 may be formed from about 100 Å to about 600 Å.

Figure 15:
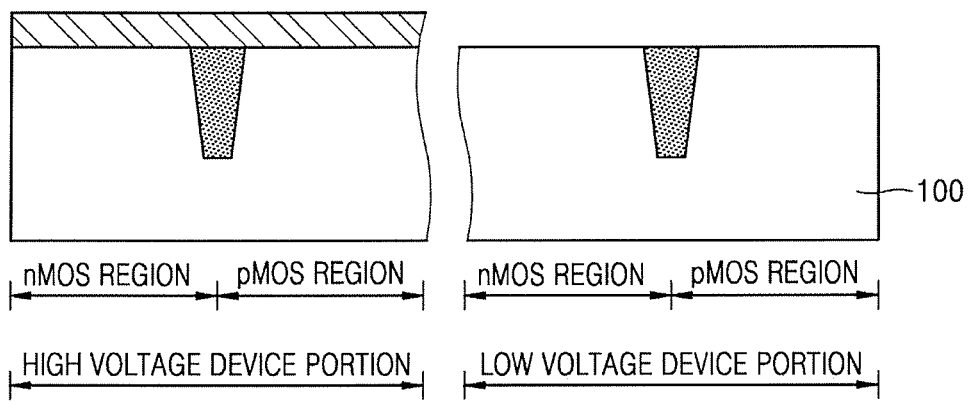

As illustrate in FIG. 15, the first gate insulating layer 120 is removed from the low voltage device portion by using the second photosensitive layer 220 as an etching mask.

The second photosensitive portion 220 may be formed on the high voltage device portion to remove the first gate insulating layer 120 from the low voltage device portion. For example, the first gate insulating layer 120 may be removed by a wet etching process.

Figure 16:
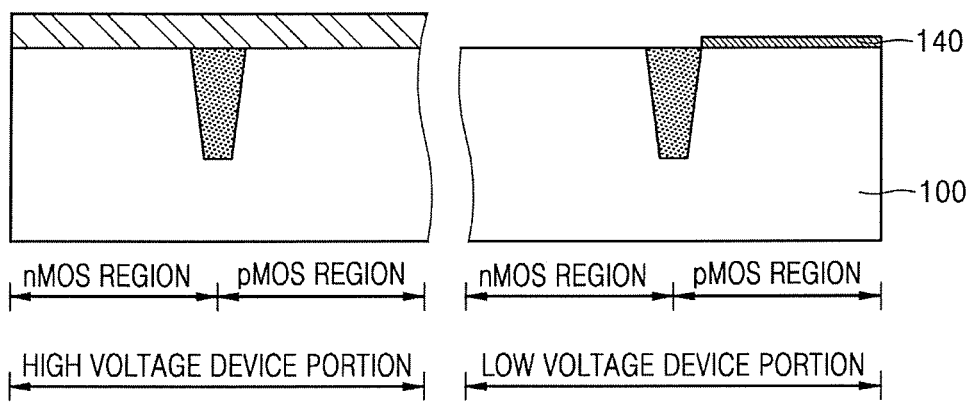

FIG. 16 shows the first semiconductor layer 140 formed on the pMOS region of the low voltage device portion by using the first photosensitive layer 210 as a mask.

The first semiconductor layer 140 formed on the pMOS region of the low voltage device portion may be formed of Si, SiGe, or a material suitable for an epitaxial growth method. Hereinafter, for purpose of illustration, the first semiconductor layer 140 is formed of SiGe.

Figure 17:
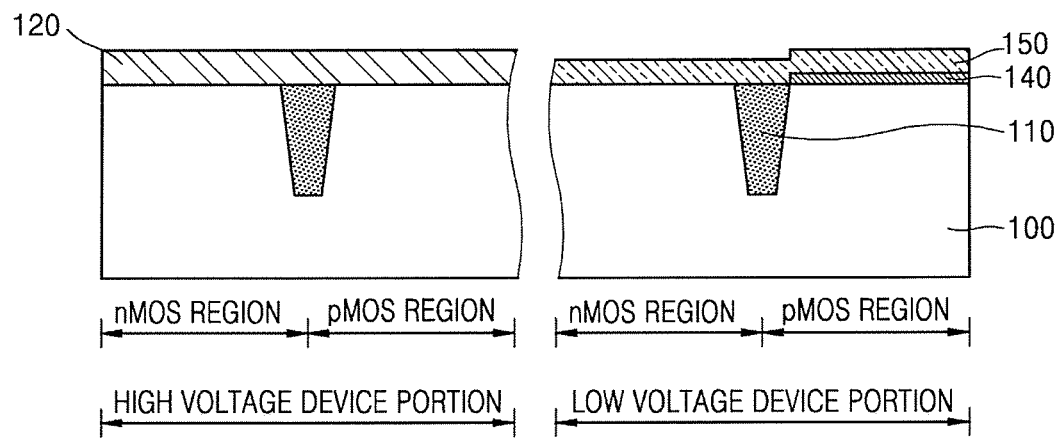

FIG. 17 shows a second gate insulating layer 150 formed on the low voltage device portion.

A mask process may be performed on the high voltage device portion to form the second gate insulating layer 150 on the low voltage device portion. The second gate insulating layer 150 may be a silicon oxide layer, a silicon nitride layer, an ONO layer, or a high-k layer having a greater dielectric constant than that of the silicon oxide layer. For example, the second gate insulating layer 150 may have a dielectric constant ranging from about 10 to about 25.

In the present exemplary embodiment of the inventive concept, it is assumed that the second gate insulating layer 150 is the high-k layer. The second gate insulating layer 150 may have a thickness equal to or less than that of the first gate insulating layer 120.

The multi-oxide process may be applied for forming a desired thickness for various gate insulating layers on the semiconductor substrate 100. The gate insulating layers may have various thicknesses so that different operating voltages may be applied thereto. For example, two types of gate insulating layers of different thicknesses may be formed on the semiconductor substrate 100 by the multi-oxide process. The region where the semiconductor device having a relatively thin gate insulating layer may be referred to as the low voltage device portion, and the region where the semiconductor device having a relatively thick gate insulating layer may be referred to as the high voltage device portion.

Figure 18:
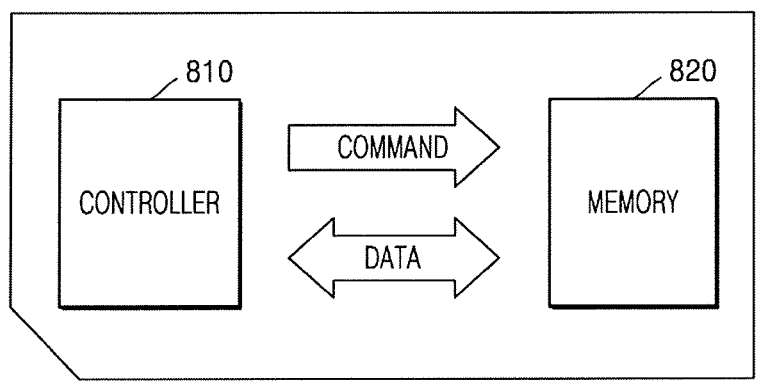
FIG. 18 shows a card including a semiconductor device according to an exemplary embodiment of the inventive concept.

FIG. 18 shows a card 800 including a semiconductor device manufactured according to an exemplary embodiment of the inventive concept.

The card 800 may include a controller 810 and a memory 820 for exchange electrical signals. For example, a command may be transmitted from the controller 810 to the memory 820 and data may be exchanged between the controller 810 and the memory 820. The memory 820 or the controller 810 may include the semiconductor device according to an exemplary embodiment of the inventive concept. The card 800 may be various kinds of cards, for example, a memory stick card, a smart media card (SM), a secure digital (SD) card, a mini secure digital card (mini SD), or a multimedia card (MMC).

Figure 19:
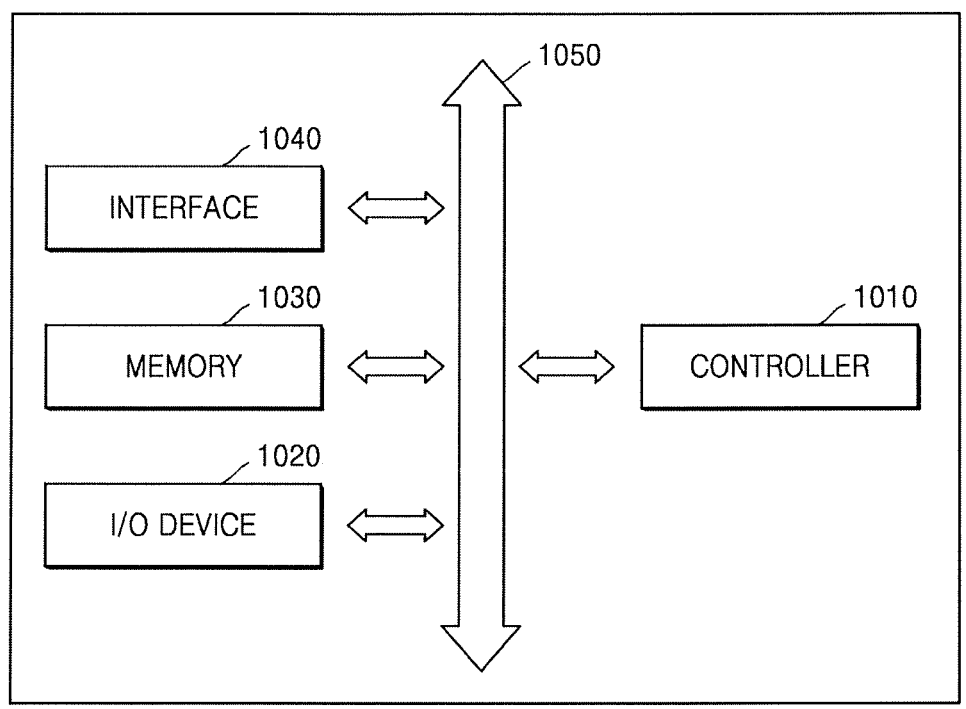
FIG. 19 shows an electronic system including a semiconductor device according to an exemplary embodiment of the inventive concept.

FIG. 19 shows an electronic system 1000 including a semiconductor device according to an exemplary embodiment of the inventive concept.

The electronic system 1000 may include a controller 1010, an input/output device 1020, a memory 1030, and an interface 1040. The electronic system 1000 may be a mobile system or a system for sending or receiving information. The mobile system may be a personal digital assistant (PDA), a portable computer, a web tablet, a wireless phone, a mobile phone, a digital music player, or a memory card.

The controller 1010 may execute programs and control the electronic system 1000. The controller 1010 may include a semiconductor device according to an exemplary embodiment of the inventive concept. The controller 1010 may be, for example, a microprocessor, a digital signal processor, a microcontroller, or a similar device.

The input/output device 1020 may communicate data with the electronic system 1000. The electronic system 1000 may be connected to an external device, for example, a personal computer or a network, via the input/output device 1020 to exchange data with the external device. The input/output device 1020 may be a keypad, a keyboard, or a display.

The memory 1030 may store codes and/or data for operating the controller 1010, and/or data processed by the controller 1010. The memory 1030 may include the semiconductor device according to the exemplary embodiment of the inventive concept. The interface 1040 may be a data transmission path between the electronic system 1000 and an external device. The controller 1010, the input/output device 1020, the memory 1030, and the interface 1040 may communicate with one another via a bus 1050.

For example, the electronic system 1000 may be a mobile phone, an MP3 player, a navigation system, a portable multimedia player (PMP), a solid state disk (SSD), or a household appliance.

Figure 20:
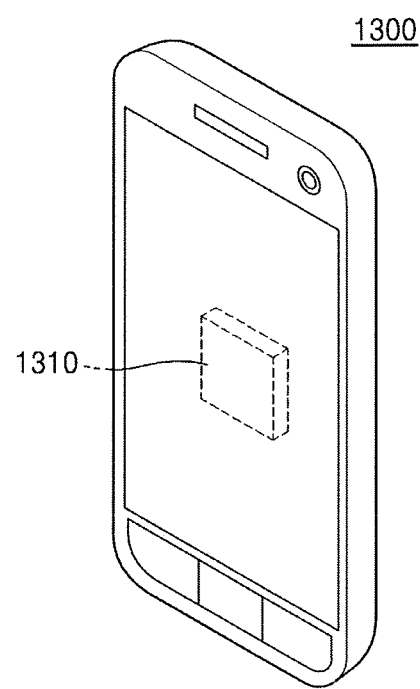
FIG. 20 is a perspective view of an electronic device including a semiconductor device according to an exemplary embodiment of the inventive concept.

FIG. 20 is a simple perspective view of an electronic device including a semiconductor device according to an exemplary embodiment of the inventive concept.

In particular, FIG. 16 shows a mobile phone 1300 having the electronic system 1000 of FIG. 15. The mobile phone 1300 may include a system-on-chip 1310. The system-on-chip 1310 may include a semiconductor device according to an exemplary embodiment of the inventive concept.

The system-on-chip 1310 may have a relatively higher performance than any other chips with the same or smaller size.

While the inventive concept has been particularly shown and described with reference to exemplary embodiments thereof, it will be understood by those of ordinary skill in the art that various changes in form and details may be made therein without departing from the spirit and scope of inventive concept as defined by the following claims.

What is claimed is:

1. A method of manufacturing a semiconductor device, the method comprising:
    preparing a semiconductor substrate having a first voltage device portion and a second voltage device portion, each including a first conductive type MOS region and a second conductive type MOS region;
    forming a first gate insulating layer on the first voltage device portion and the second voltage device portion;
    removing the first gate insulating layer from the first conductive type MOS region of the first voltage device portion to expose a part of the semiconductor substrate;
    forming a first semiconductor layer on the first conductive type MOS region of the first voltage device portion;
    removing the first gate insulating layer from the second conductive type MOS region of the first voltage device portion to expose a part of the semiconductor substrate, and
    forming a second gate insulating layer exclusively on the first voltage device portion after removing the first gate insulating layer from the second conductive type MOS region of the first voltage device portion.

2. The method of claim 1, wherein the forming of the first semiconductor layer comprises epitaxially growing a material having a different lattice constant from that of the semiconductor substrate.

3. The method of claim 1, wherein a higher voltage is applied to the first voltage device portion and a lower voltage is applied to the second voltage device portion.

4. The method of claim 1, wherein a source region and a drain region in the first conductive type MOS regions include p-type dopants, and a source region and a drain region in the second conductive type MOS regions include n-type dopants.

5. The method of claim 1, wherein the first gate insulating layer is formed by a medium temperature oxide (MTO) process.

6. The method of claim 1, wherein a wet etching process is performed to remove the first gate insulating layer.

7. The method of claim 1, further comprising, after forming of the first gate insulating layer on the first voltage device portion and the second voltage device portion;
    forming a hard mask layer on the first gate insulating layer; and
    removing the hard mask layer from the first conductive type MOS region of the first voltage device portion to expose a part of the first gate insulating layer.

8. The method of claim 7, wherein the hard mask layer is a silicon nitride layer.

9. The method of claim 1, wherein a dielectric constant of the second gate insulating layer is greater than that of the first gate insulating layer.

10. A method of manufacturing a semiconductor device, the method comprising:
    preparing a semiconductor substrate divided into a high voltage device portion and a low voltage device portion, each including a pMOS region and an nMOS region;
    forming a first gate insulating layer and a silicon nitride layer on the high voltage device portion and the low voltage device portion;
    patterning the silicon nitride layer in the pMOS region of the low voltage device portion by using a patterned first photosensitive layer;
    removing the first gate insulating layer from the pMOS region of the low voltage device portion by using the patterned silicon nitride layer to expose a part of the semiconductor substrate;
    removing the patterned silicon nitride layer;
    forming a first semiconductor layer on the pMOS region of the low voltage device portion; and
    removing the first gate insulating layer from the nMOS region of the low voltage device portion by using a patterned second photosensitive layer to expose a part of the semiconductor substrate.

11. The method of claim 10, wherein the forming of the first semiconductor layer comprises epitaxially growing a silicon germanium (SiGe) layer.

12. The method of claim 10, wherein a wet etching process is performed to remove the first gate insulating layer.

13. The method of claim 10, further comprising, after removing the first gate insulating layer from the nMOS region of the low voltage device portion, forming a second gate insulating layer on the low voltage device portion.

14. The method of claim 13, wherein a dielectric constant of the second gate insulating layer is greater than that of the first gate insulating layer.

15. A method of manufacturing a semiconductor device, the method comprising:
    forming a semiconductor substrate having a first voltage device portion and a second voltage device portion, each including a first conductive type MOS region and a second conductive type MOS region;
    forming a first gate insulating layer on the first voltage device portion and the second voltage device portion;
    removing the first gate insulating layer from the first voltage device portion to expose the first voltage device portion on the semiconductor substrate; and
    forming a first semiconductor layer on the first conductive type MOS region of the first voltage device portion,
    wherein the first gate insulating layer is at least partially removed from the second conductive type MOS region before the first semiconductor layer is formed on the first conductive type MOS region.

16. The method of claim 15, wherein a higher voltage is applied to the first voltage device portion and a lower voltage is applied to the second voltage device portion; and
    wherein a source region and a drain region in the first conductive type MOS regions contain p-type dopants, and a source region and a drain region in the second conductive type MOS regions contain n-type dopants.

17. The method of claim 15, further comprising, after forming of the first gate insulating layer on the first voltage device portion and the second voltage device portion;
   forming a first mask layer on the first gate insulating layer; and
   patterning the first mask layer on the first voltage device portion by using a patterned first photosensitive layer.

18. The method of claim 15, further comprising, after removing the first gate insulating layer from the first voltage device portion to expose the first voltage device portion on the semiconductor;
   forming a second mask layer on the first voltage device portion and the second voltage device portion; and
   patterning the second mask layer on the first conductive type MOS region of the first voltage device portion by using a patterned second photosensitive layer.

19. The method of claim 15, further comprising, after forming the first semiconductor layer in the first conductive type MOS region of the first voltage device portion, forming a second gate insulating layer on the first voltage device portion.

* * * * *